United States Patent [19]

Haws et al.

[11] Patent Number: 4,998,181
[45] Date of Patent: Mar. 5, 1991

[54] COLDPLATE FOR COOLING ELECTRONIC EQUIPMENT

[75] Inventors: James L. Haws, McKinney; Timothy C. Fletcher, Garland; Lian-Tuu Yeh; John L. Darrouzet, both of Dallas, all of Tex.

[73] Assignee: Texas Instruments Incorporated, Dallas, Tex.

[21] Appl. No.: 430,910

[22] Filed: Oct. 31, 1989

Related U.S. Application Data

[63] Continuation of Ser. No. 132,298, Dec. 15, 1987, abandoned.

[51] Int. Cl.$^5$ .............................................. H05K 7/20
[52] U.S. Cl. .................................. 361/385; 165/80.4; 361/382; 361/386
[58] Field of Search .................. 174/15 HP; 165/80.4, 165/104.33; 157/79, 82; 361/382–389

[56] References Cited

U.S. PATENT DOCUMENTS

| | | | |
|---|---|---|---|
| 3,198,990 | 8/1965 | Katzin | 361/383 |
| 3,818,983 | 6/1925 | Grandia | 361/385 |
| 4,044,396 | 8/1977 | Haws et al. | 361/388 |
| 4,559,580 | 12/1985 | Lutfy | 361/385 |

OTHER PUBLICATIONS

Haws, "Phase Array Thermal Control System Concepts", Proceedings of the International Symposium on Cooling Technology for Electronic Equipment, Mar. 1987, pp. 138–148.

*Primary Examiner*—Gregory D. Thompson
*Attorney, Agent, or Firm*—René E. Grossman; Melvin Sharp

[57] ABSTRACT

A system for cooling, positioning and supporting phased array microwave modules within a phased array radar system wherein the modules are disposed in cooling tubes, the cooling tubes being arranged to permit coolant to continuously pass in close proximity thereto along channels formed in a coldplate. The channels can be built into a solid member wherein the cooling tubes are hollowed out portions of the solid with channels for coolant formed in the space between cooling tubes. In alternate embodiments, the channels are formed by the spaces between cooling tubes.

10 Claims, 11 Drawing Sheets

4,998,181

COLDPLATE FOR COOLING ELECTRONIC EQUIPMENT

This application is a continuation of application Ser. No. 07/132,298, filed Dec. 15, 1987, now abandoned.

BACKGROUND OF THE INVENTION

1. Field of the Invention

This invention relates to a system for cooling, positioning and supporting electronic modules and, more specifically, but not limited to, such a system for use in conjunction with phased array microwave modules, primarily for use in phased array radar.

2. Brief Description of the Prior Art

A phased array radar system is formed from many transmit receive (T/R) microwave modules, one or more such modules being disposed in one or more apertures. One of the most critical problems in design and operation of a phased array system and particularly an airborne phased array system is the removal of heat from the modules within the aperture or apertures.

The modules dissipate a large amount of heat in a small volume. In order to maintain high system reliability, the heat dissipated by the modules must be removed while maintaining low component temperatures inside the modules. Also, since the microwave devices and circuits within the modules are temperature sensitive, low temperature gradients from module to module within the aperture and/or from aperture to aperture must be maintained. In addition, to assist in system start up, the thermal control system must also be capable of accommodating additional heat for system warm-up at start-up.

The system must be low cost, light weight, small in volume and consume a minimum amount of power. It must also fit into the physical constraints imposed by the module, aperture and vehicle for which the phased array system is configured. Sufficient room must be provided inside the modules to mount the circuits. The thermal, mechanical and structural system must not interfere with DC, RF and logic signal distribution circuits, electrical connectors, antenna elements, module tie down or module removal.

In one prior art approach to the above noted problems, air is blown between spaced apart modules and provides convection cooling between modules and the air stream. This cools the module cover and the devices inside the module which are linked to the cover through a conductive thermal path within the module. The cooling air is supplied to the modules by air ducts at the end of the air passages. This design is simple and light weight, however it is limited to modules with very low heat dissipations because of the large convective temperature rise and amount of power required to supply the large volume of air needed. The large air requirement handicaps the aircraft because the air must be delivered to remote parts of the aircraft. Air cooling also makes temperature gradient control and warm-up of the modules very difficult.

In a further prior art device, each module is mounted on a coldplate containing a circulating cooling fluid. The microwave circuits are mounted on the surface which will contact the coldplate, resulting in a small temperature rise from the fluid to the circuits. This system has the disadvantage of reduced maintainability since it is necessary to remove an entire row of modules to service a single module. The coldplate also adds extra weight to the system. All liquid systems will require an external heat exchanger and pump. This sacrifice must be made in order to cool high heat dissipation modules. The above described prior art is discussed in Haws, J. L., "Phased Array Thermal Control System Concepts", Proceedings Of The International Symposium On Cooling Technology For Electronic Equipment, March, 1987, Page 138.

A still further prior art thermal control system utilizes heat pipes and is an acceptable design approach, though it has some significant disadvantages. The disadvantages are in the areas of performance, cost and producibility. The heat pipes are costly to build because of their strict thermal performance requirements in a dynamic environment (i.e., they are sensitive to gravity changes, such as the aircraft acceleration, which has a drastic impact on the thermal performance of the heat pipes). The heat pipes are perpendicular to the center lines of the modules and the energy emanating from the modules is perpendicular to the heat pipes. Accordingly, during maneuvering of the aircraft, the heat pipe function can be lost completely or at least partially impaired. The heat pipes also impact the electrical performance of the phased array systems because the difference in thermal performance from heat pipe to heat pipe impacts the transmitted phase of the microwave modules. This system concept also requires a very complex and costly liquid cooled coldplate, making this approach undesirable. The above described prior art is discussed in Haws, J. L., "Phased Array Thermal Control System Concepts", Proceedings of the International Symposium on Cooling Technology for Electronic Equipment, March, 1987, Page 138.

A yet further prior art thermal control system as disclosed in U.S. Pat. No. 4,044,396 uses heat pipes which are positioned longitudinally relative to the modules and the long dimension of the aircraft and parallel to the direction in which heat is radiated out from the modules. In this arrangement, the failure of the heat pipes due to gravity forces is minimized. However, since heat pipes are required, the inherent problems associated with heat pipes as set forth hereinabove are present. The above cited publication further discusses such system.

It is therefore readily apparent that the prior art systems for cooling phased arrays of the type herein noted all have inherent undesirable limitations which should be minimized.

SUMMARY OF THE INVENTION

In accordance with the present invention, the above noted problems of prior art cooling system are minimized and there is provided a system for cooling, positioning and supporting phased array microwave modules within a phased array radar system. The system comprises a lightweight combination support structure and heat exchanger which allows module cooling via air, liquid, refrigerant, change of phase and thermal siphon (wickless heat pipe) cooling techniques. The cooling portion of the heat exchanger or cooling system is easily placed next to high heat dissipation areas within the microwave modules. The combination support structure and heat exchanger can be fabricated using laser welding, vacuum brazing, bonding or low to high temperature brazing techniques for various metals.

Briefly, in accordance with a first embodiment of the invention, the above is accomplished by interfacing microwave modules with a coldplate constructed of tubes and plates. Module construction herein is shown as being of circular cross section. However, it should be understood that the modules can take on other shapes as, for example, square, rectangular, elliptical, etc. The coldplate is used in conjunction with T/R modules with different heat dissipations because air, liquid, change of phase, thermal siphon or refrigerant cooling can be used in conjunction therewith. Heat pipes are not used. RF and DC manifolds are mounted on the aft side of the coldplate and are constructed as "planar" manifolds or as "slat" manifolds. Planar manifolds are thin RF stripline board assemblies that mount perpendicular to the longitudinal axis of modules and slat manifolds are also thin RF stripline board assemblies, but they mount parallel to the longitudinal axis of the modules. Planar manifold result in thinner arrays because less volume is used to incorporate them into a phased array system. The coldplate assembly also mechanically positions single and multiple antenna element modules to the required mechanical positional accuracy. The coldplate provides the required thermal control of the modules to achieve system performance and structurally supports the modules in dynamic shock and vibration environments.

The coldplate provides cooling for the T/R modules, wherein coolant enters an aperture at one end of the tube/plate coldplate and moves forward in the aperture until it reaches the inlet fluid manifold which is located around the perimeter of the array. The inlet fluid manifold is located in line with the hot or hottest spot within the T/R modules. Coolant then passes through fixed or adjustable orifices and flows radially along and around the modules and into the center of the array from the inlet manifold. Small openings, located at the center of the coldplate between the inlet manifold and the outlet manifold, forces the coolant fluid to change direction at the center of the array and travel to the outlet manifold. The coolant then flows radially outward along and around the modules to the perimeter of the array. The coolant is collected around the perimeter of the array and passes out of the array at the fluid outlet. Heat dissipated by the T/R modules is picked up by the coolant and is exchanged with an external heat exchanger. The coolant is then recycled. Fast system warm-up is achieved by adding heat to the circulating fluid at the external heat exchanger during system warm-up.

Since the array reliability is very high, it is desirable to use redundant cooling loops within the coldplate because the system components that supply the coolant have lower reliability than the array. Redundant cooling loops are achieved by using multiples of the cooling structure paralleling each other or with each loop cooling a different portion of each module.

The coldplate tubes and the module covers comprise very light weight thin wall tubes which are manufactured using standard "precision drawn" manufacturing processes. These tubes are very low cost, easy to produce and can be easily manufactured to extremely tight dimensional accuracy. The tight dimensional control on the module covers and mating tube in the coldplate allows excellent thermal interfacing between the modules and coldplate. This results in lower overall module and device junction temperatures and lower module to module temperature variations to reduce the module to module electrical phase errors. Coldplate tubes and plates may be made of aluminum, stainless steel, titanium, beryllium, Kovar or other metal, depending upon the weight, heat transfer, thermal coefficient of expansion, and strength requirements of the particular system application. In general, such materials are chosen for minimum weight, maximum strength and maximum heat transfer properties. Module cover tubes are made of a low expansion material, such as Kovar, low expansion nickel alloys, beryllium or stainless steel. Such materials are chosen for low expansion, maximum strength, minimum weight and maximum heat transfer properties to match the thermal expansion of the module package material which is in turn matched to the thermal expansion of the microwave devices inside the module packages. Both tubes and module cover materials must be compatible with assembly processes, i.e., welding, brazing soldering, EB welding, etc.

In accordance with a second embodiment of the invention, the tube/plate coldplate concept is used as a thermal siphon cold plate. The tube/plate coldplate forms a unique enclosure for holding a liquid refrigerant charge which cools the modules. Liquid refrigerant is retained at the base of the coldplate within the coldplate. As the modules dissipate heat, the liquid refrigerant in the coldplate boils and changes to a vapor. The vapor moves upward through the coldplate tubes and contacts a cooling coil at the top of the array. As the vapor moves past the tubes, additional heat is transferred to the vapor from the modules. When the vapor contacts the cooling coil at the top of the array, it condenses back into a liquid. The liquid runs back down past the tubes and is again changed into a vapor as it picks up heat dissipated by the modules. This thermal siphon (wickless heatpipe) method of cooling provides excellent temperature gradient control across the face of the array and is capable of removing large amounts of heat from the modules and capable of maintaining very low temperature gradients across the array.

In accordance with a third embodiment of the invention, the modules are arranged in a somewhat matrix fashion wherein the modules of first alternate columns are each in the same first group of rows and the modules of the second alternate columns therebetween are in the same second group of rows, the second group of rows being spaced upwardly or downwardly between the first group of rows to provide a corrugated appearance. Channels are formed along each of the columns for receiving coolant, the coolant entering along the entire length of the first channels, connecting to the second channels and then travelling the length of the second channels back to a coolant reservoir or manifold which encircles the array and wherein heat is removed from the modules via the circulating coolant. In this way, the modules are substantially completely surrounded by coolant which is spaced therefrom by a very small dimension.

In accordance with a fourth embodiment of the invention, the modules are arranged in the same manner as described in the third embodiment. However, the tubes that position and support the modules are brazed, soldered or bonded together along the longitudinal length of the tubes. This forms triangular coolant passages along the longitudinal axis of the tubes and modules. Air coolant is used to provide module cooling. Inlet cooling air is circulated around the outer perimeter of the array into a radome covering the modules and is then passed through the triangular coolant passages along the longitudinal axis of each module. The heat picked up by the circulating air as it passes the modules/tubes is exchanged with an external heat exchanger remote from the array.

In accordance with a fifth embodiment of the invention, the housing is comprised of a central section with apertures therethrough for retaining modules therein. Channels are disposed through the central section and around the apertures for conducting liquid coolant therein to remove heat from the apertures. Top and bottom sections enclose the central section, one of the top and bottom sections having a manifold on one side thereof for receiving coolant liquid from the exterior of the housing and conducting it it through grooves therein to the channels. The other of the top and bottom also has channels therein for receiving the cooling liquid which has passed through the central section and conducting the liquid to a manifold on a side thereof, the liquid then being remove from the housing via the manifold.

In accordance with a sixth embodiment of the invention, lightweight plastic inserts are positioned in channels of the prior discussed embodiments, the insert being preferably of plastic and being designed to permit coolant liquid to travel through the channels, but with restricted flow rate due to the partial blockage of the channels by the inserts.

DESCRIPTION OF THE PREFERRED EMBODIMENTS

Figure 1:
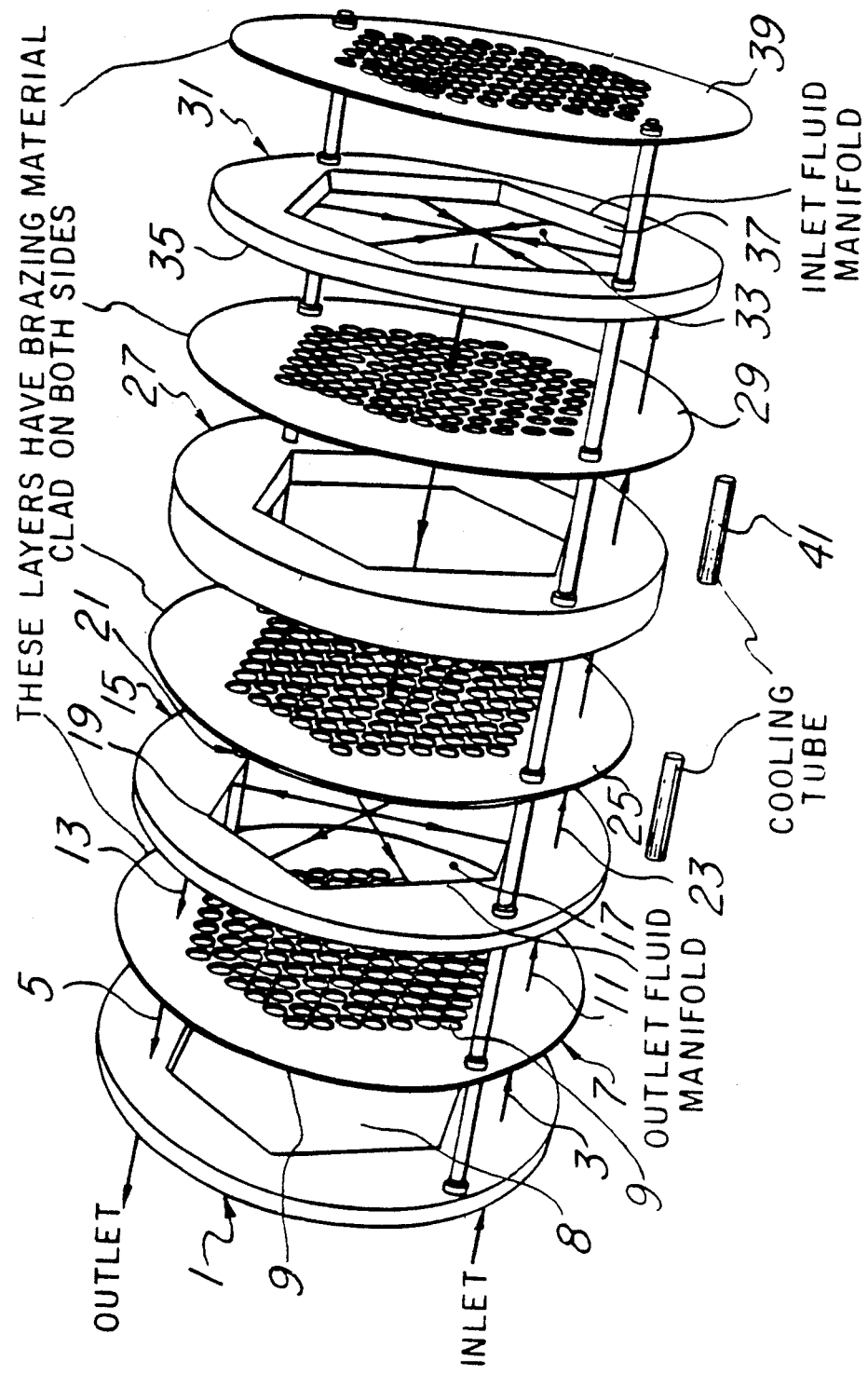
FIG. 1 is an exploded view of a tube/plate coldplate in accordance with a first embodiment of the present invention.

Referring first to FIG. 1, there is shown a tube/plate coldplate in accordance with a first embodiment of the present invention. The coldplate includes an aluminum endplate 1 having apertures 3 and 5 therethrough which conduct inlet coolant into the coldplate and outlet coolant out of the coldplate respectively. The endplate 1 also includes a hexagonally shaped aperture 8 in its central region. Positioned adjacent to the endplate 1 is an apertured aluminum disk 7 having apertures 9 therein and apertures 11 and 13 which align with apertures 3 and 5, respectively. The disk 7 is clad on both sides thereof with aluminum alloy brazing material. A machined aluminum outlet fluid manifold 15 is positioned adjacent the disk 7 and includes a hexagonally shaped aperture 17 at its center region to expose the apertures 9 in disc 7 and of the same dimensions as the aperture 8. An outlet fluid manifold groove 19 surrounding the aperture 7 is connected to a fluid outlet aperture 21 which is aligned with the apertures 13 and 5. Also, an inlet fluid aperture 23 is aligned with the apertures 11 and 3. The groove 19 also receives fluid entering at the central region of the hexagonal aperture 17 and travelling around the modules thereto. The coldplate is fully sealed to the outside and the coolant flows as a result of the coolant supply pressure. The coolant also totally fills any voids between tubes and plates, thus totally surrounding each tube.

A second apertured aluminum disk 25, identical to the disk 7 except for small fluid passage apertures 2 located in the outer position of the disk, is positioned adjacent the outlet manifold 15 with all apertures therein aligned with those of disk 7. A central plate 27 which is shaped the same as the end plate 1 is positioned adjacent the disk 25 with inlet aperture aligned therewith. A third apertured aluminum disk 29, identical to the disk 25, is positioned adjacent the central plate 27 with all apertures therein aligned with those of disk 7. An inlet fluid manifold 31, machined of aluminum plate, is positioned adjacent the disk 29 and includes a hexagonally shaped aperture 33 at its center region to expose the apertures in the disk 29 and of the same dimension as the aperture 8. An inlet fluid manifold groove 35 surrounding the aperture 33 connected to an aperture 37 which is aligned with the inlet apertures 11 and 3. A fourth apertured aluminum disk 39, identical to the disk 7 except that it contains no apertures corresponding to apertures 3 and 5 thereof, is positioned adjacent the inlet fluid manifold 31.

Figure 3:
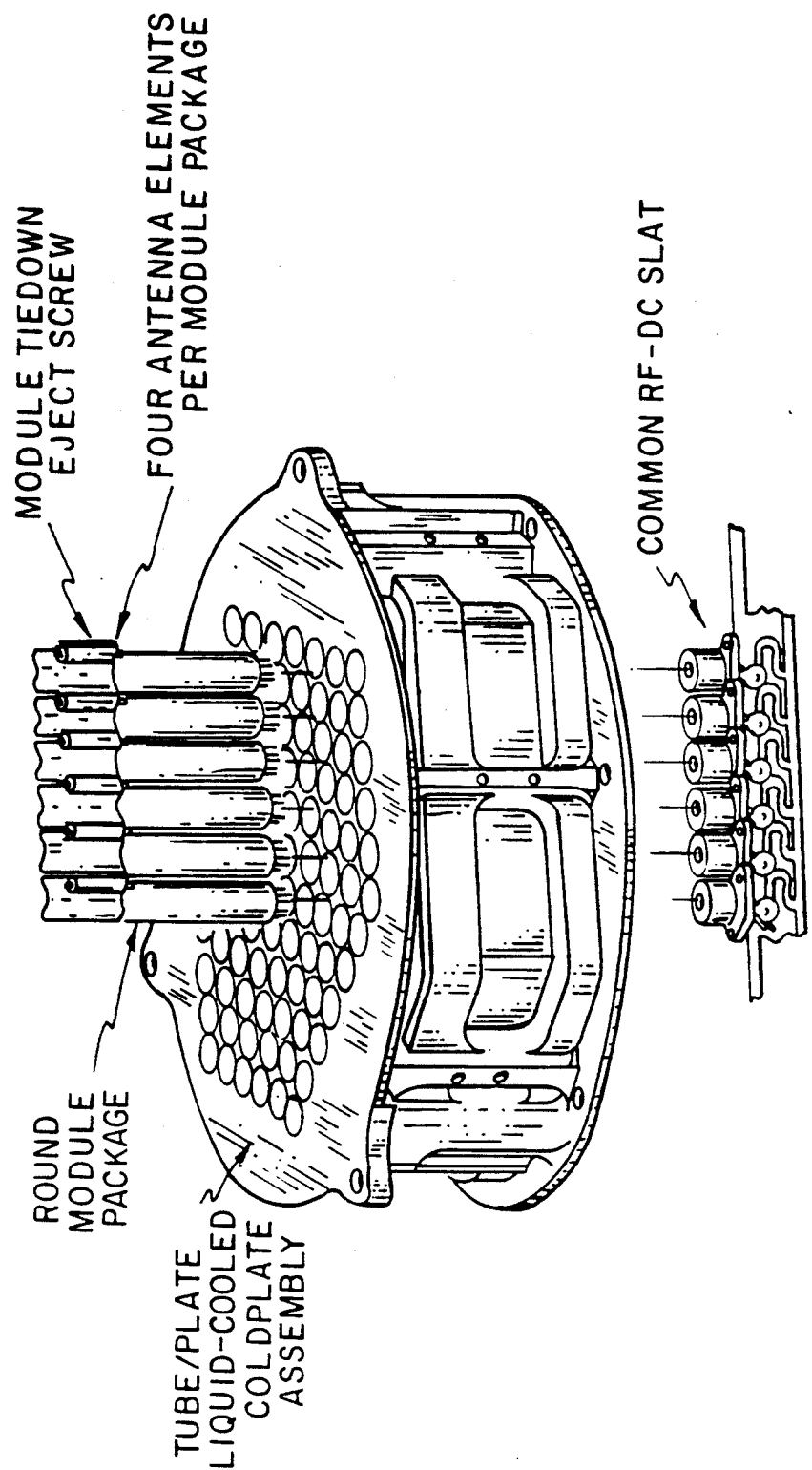
FIG. 3 is a perspective view of the embodiment of FIG. 1 with modules and RF/DC manifolds being positioned in the coldplate in the completely machined state.

The above noted elements are placed in intimate contact with each other in the order as explained, cooling tubes 41 made of aluminum or aluminum tubing, clad with aluminum brazing alloy on the outside diameter only, are positioned in each of the aligned apertures and the whole assembly is vacuum brazed together in a vacuum oven by raising the temperature to the brazing temperature of the aluminum alloy brazing material whereby the various elements are brazed to each other and to the cooling tubes to provide the final light weight machined coldplate structure as shown in FIG. 3. Alternate assembly methods would include soldering plated aluminum parts or bonding the parts together with an epoxy.

Figure 2:
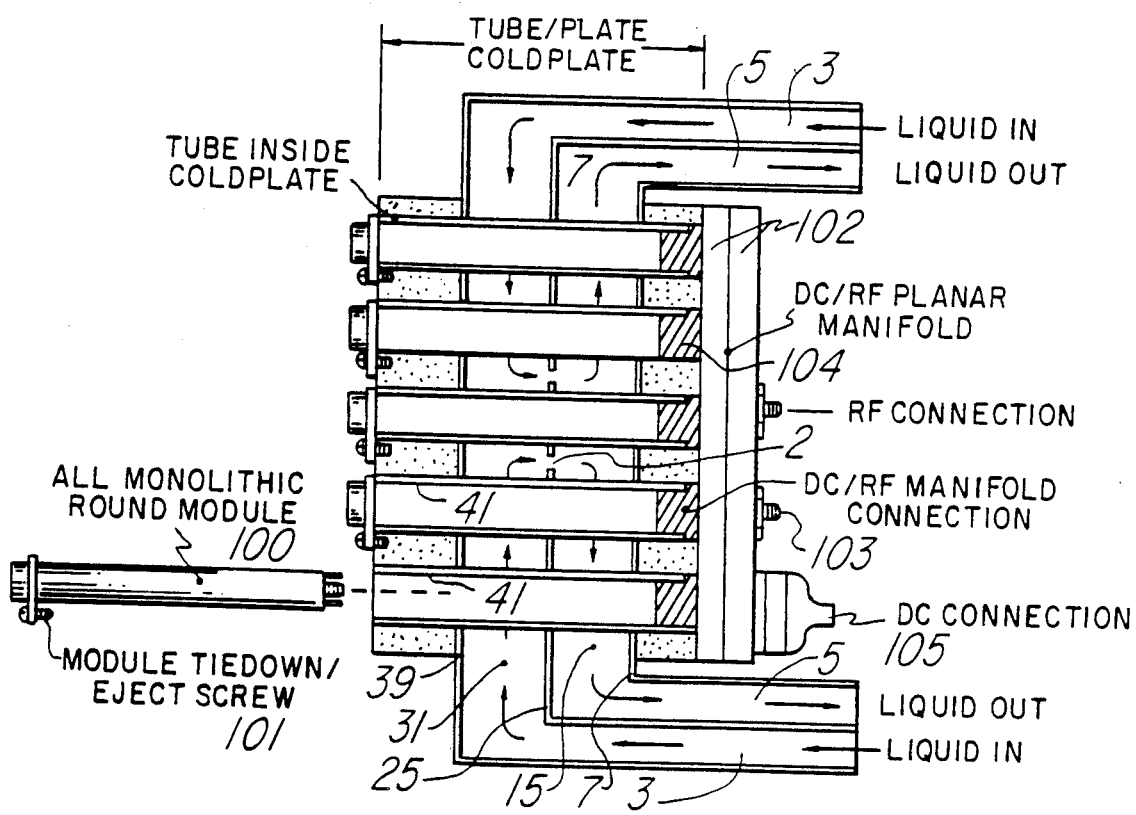
FIG. 2 is an approximate cross sectional view of the embodiment of FIG. 1 taken along the center thereof to show the fluid flow through the coldplate when items 1, 27 and 29 are eliminated.

DC and RF electrical distribution manifolds 102 and connectors 103, 104, 105 are attached to the aft of the coldplate and radar modules 100 are then placed into the cooling tubes 41 and secured therein, such as by screwing a flange on the surface of the module 100 to the coldplate using a module tiedown/eject screw 101 in the manner shown in FIGS. 2 and 3. Coolant is than forced through the inlet apertures 3 to the inlet fluid manifold 3 where it enters inlet fluid manifold groove 35 and travels there from around the cooling tubes 41, holding the modules, to the center region of the inlet manifold. The central region of the disks 25 and 29 have small fluid passage apertures therein which permit the coolant to travel from the central region of the inlet manifold 31 to the central region of the outlet fluid manifold 15. The coolant then travels around the cooling tubes 41 to the outlet fluid manifold groove 19 and out of the coldplate via the outlet aperture 5 therein. The first embodiment described fairly equally distributed coolant along the total length of the radar modules.

The endplate 1, central plate 27 and the disk 29 could be eliminated to move the inlet fluid manifold 31 and the outlet fluid manifold 15 closer together for short length radar modules (100 in FIGS. 2 and 3), or the central plate 27 could be made thicker for longer length radar modules (100 in FIGS. 2 and 3). Central plate 27 and disk 29 could be eliminated to concentrate the coolant at one local point on a radar module 100, or the assembly could be easily modified to concentrate coolant at two separate points on a radar module 100. The assembly could be easily changed for a different number of radar modules 100, or for different sizes of radar module 100.

Figure 4:
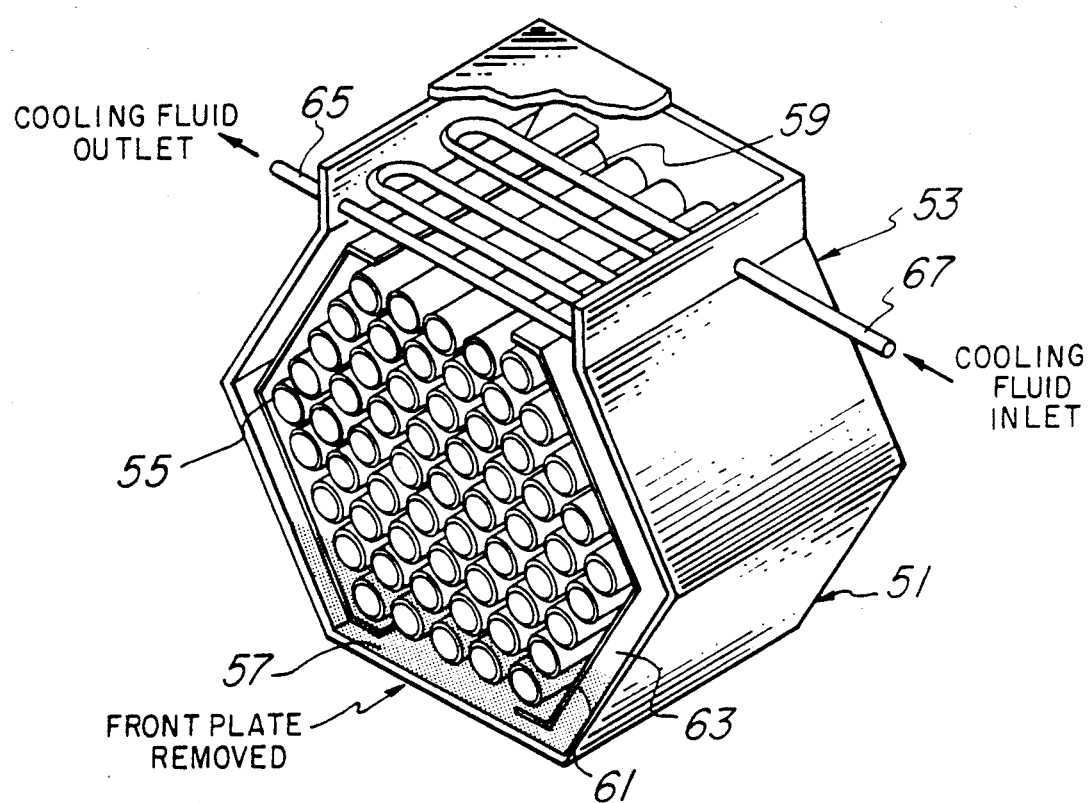
FIG. 4 is a partially cut away view of a second embodiment of the present invention.

Referring now to FIG. 4, there is shown a second embodiment of the invention using thermal-siphon cooling principles in accordance with the present invention. In this embodiment there is shown a housing 51 having a rear plate 53 and a front plate (not shown) to provide an enclosure. A plurality of cooling tubes 55 having modules (not shown) therein are positioned in rows and columns as in the first embodiment with refrigerant 57, such as, for example, Freon 12 or Freon 22, in the bottom portion of the housing. A cooling coil 59 is positioned at the top of the housing and a wall 61 forms a channel 63 along with the housing interior.

In operation, upon generation of module dissipated heat within the cooling tubes 55, the refrigerant 57 will vaporize and travel upwardly along the cooling tubes and remove heat from the cooling tubes. Upon reaching the cooling coil 59, the refrigerant will condense and drop back to the bottom of the housing, travelling around the cooling tubes at this time. In the event the vaporized refrigerant is travelling upwardly in sufficient quantity to impede the downward flow of the condensed refrigerant at the cooling coil 59, the condensed refrigerant will travel to the bottom of the housing via the channel 63. It is understood that the cooling fluid exiting the cooling fluid outlet 65 will enter a heat exchanger where it will be cooled down and returned to the cooling fluid inlet 67.

Figure 5:
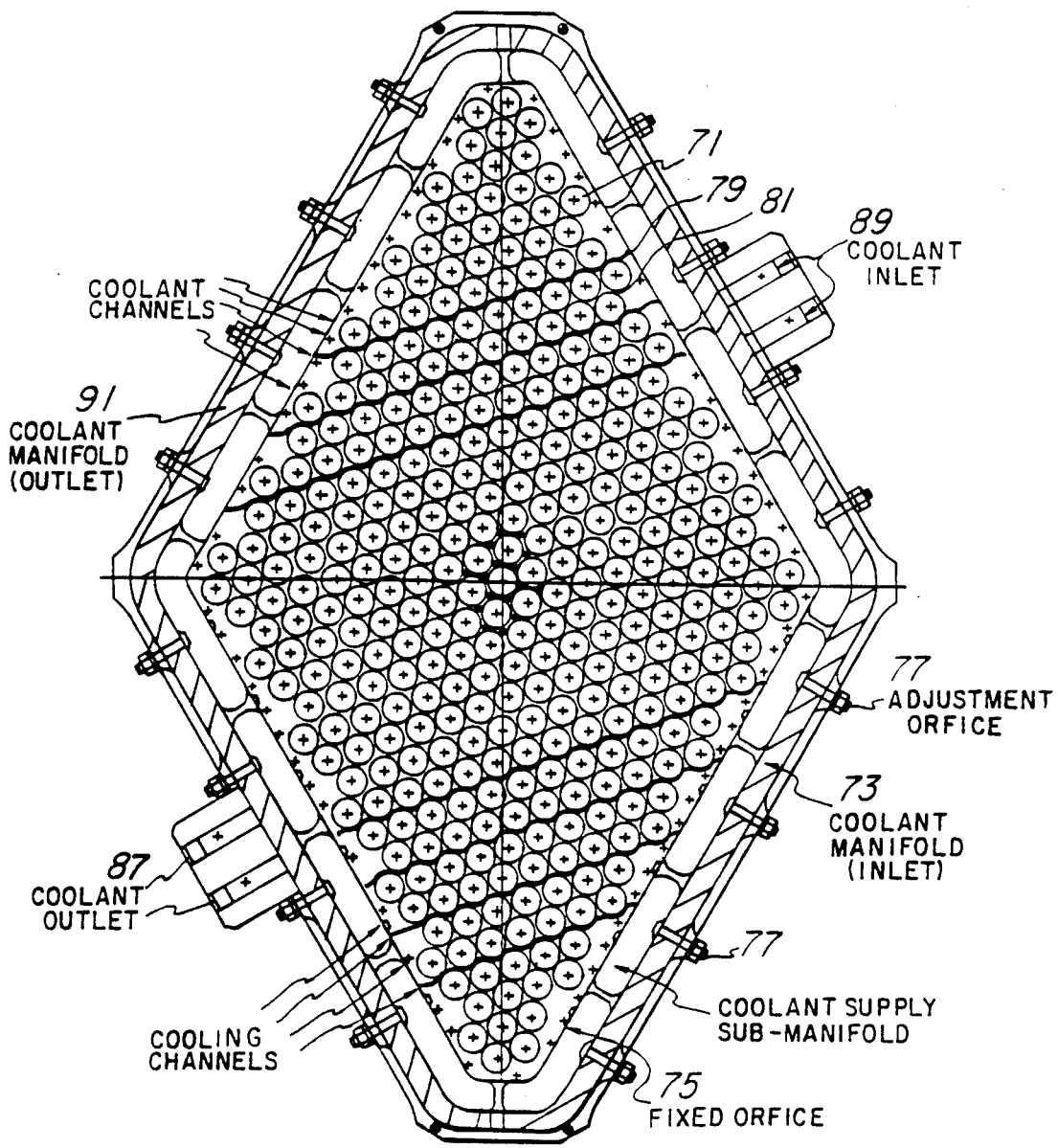
FIG. 5 is a drawing of a third embodiment of the present invention.
Figure 6:
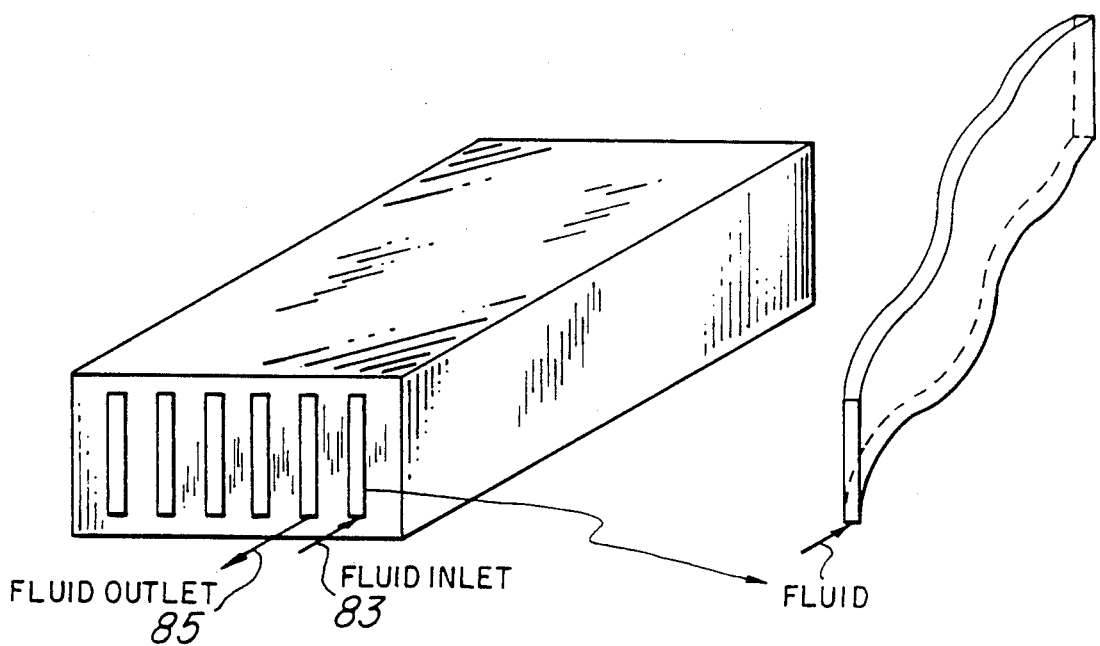
FIG. 6 is an enlarged view of the fluid inlets and fluid outlets of the embodiment of FIG. 5.
Figure 7:
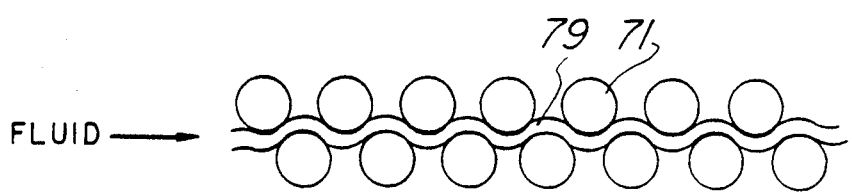
FIG. 7 is a drawing showing one of the refrigerant cooling channels of the embodiment of FIG. 5.

Referring now to FIGS. 5, 6 and 7, there is shown a third embodiment of the invention built using "I-beam" cooling channels. In this embodiment the cooling tubes 71 with modules therein are machined as holes through "I-beam" cooling channels. This forms a module matrix arrangement of the type discussed in connection with the first embodiment. Long straight or serpentine "I-beam" cooling channels 72 are laser or electron-beam welded together and to periphery fluid manifolds 73, 75, 91 to form coldplate assemblies as shown in FIGS. 5 and 6. Coolant is located around the periphery of the matrix in a coolant main supply manifold 73 and travels therefrom to a coolant supply sub-manifold 75 via adjustable orifices 77. Because they are machined from a common piece of aluminum plate, the cooling tubes 71 along each column are in thermal contact with each other and form cooling channels 79 (also FIGS. 6 and 7) for incoming coolant and cooling channels 81 for outgoing coolant. The channels are arranged so that, for each incoming coolant channel, the adjacent channel is an outgoing coolant channel as shown in FIG. 6. Each channel is of serpentine shape as shown in FIG. 7 due to the positioning of the cooling tubes 71. For modules and cooling tubes arranged in a rectangular positioning, the coolant channels would be straight rather than serpentine shaped. The coolant enters the array through a fluid inlet 83 and exits through a fluid outlet 85 as shown in FIGS. 5 and 6. The coolant exiting the outlet fluid manifold 91 is cooled by removal therefrom at the coolant outlet 85 to a heat exchanger (not shown) with recirculation of the cooled coolant back to the inlet coolant manifold 73 via the coolant inlet 89.

Figure 8:
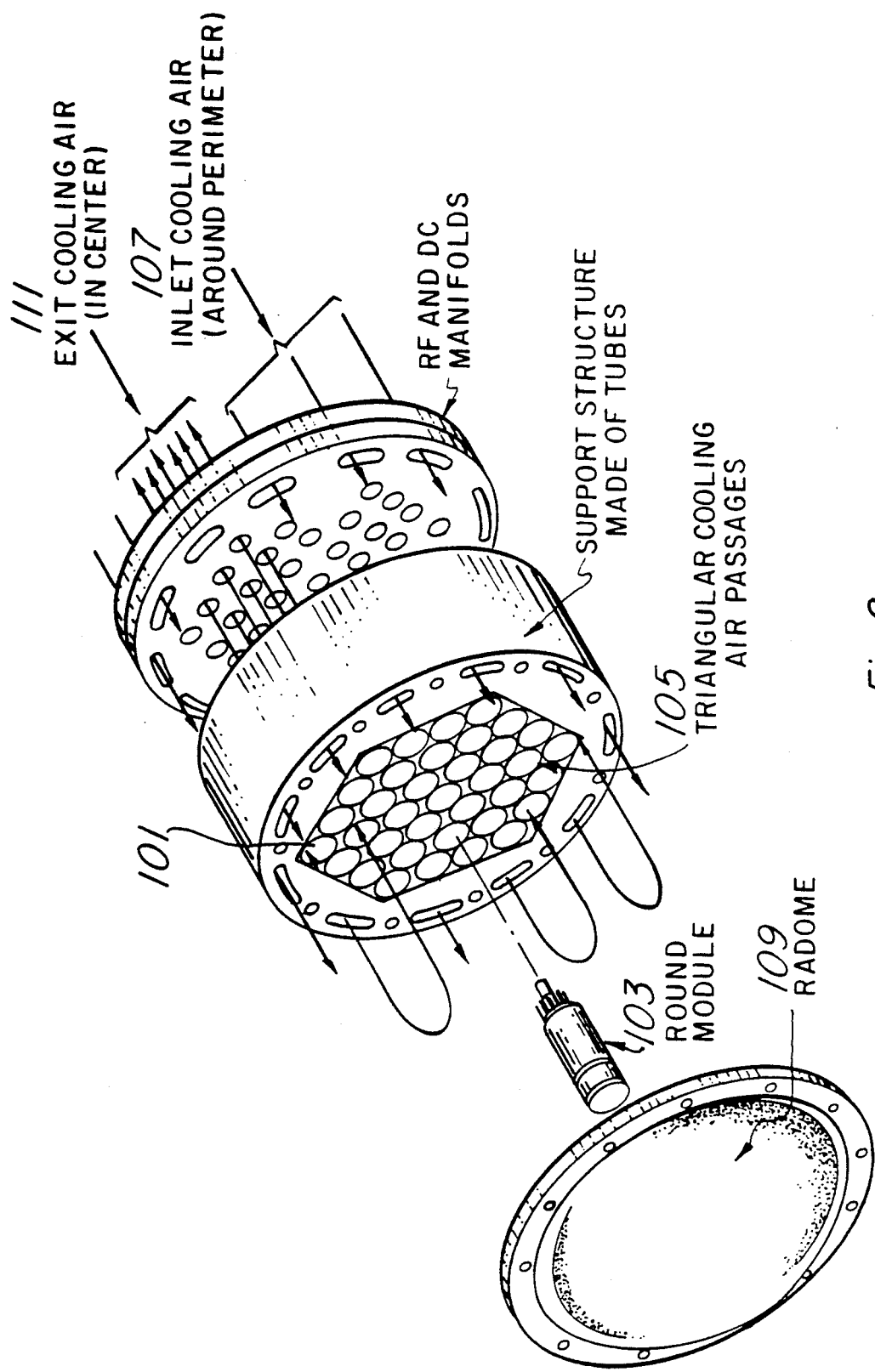
FIG. 8 is a drawing of a fourth embodiment of the present invention.
Figure 9:
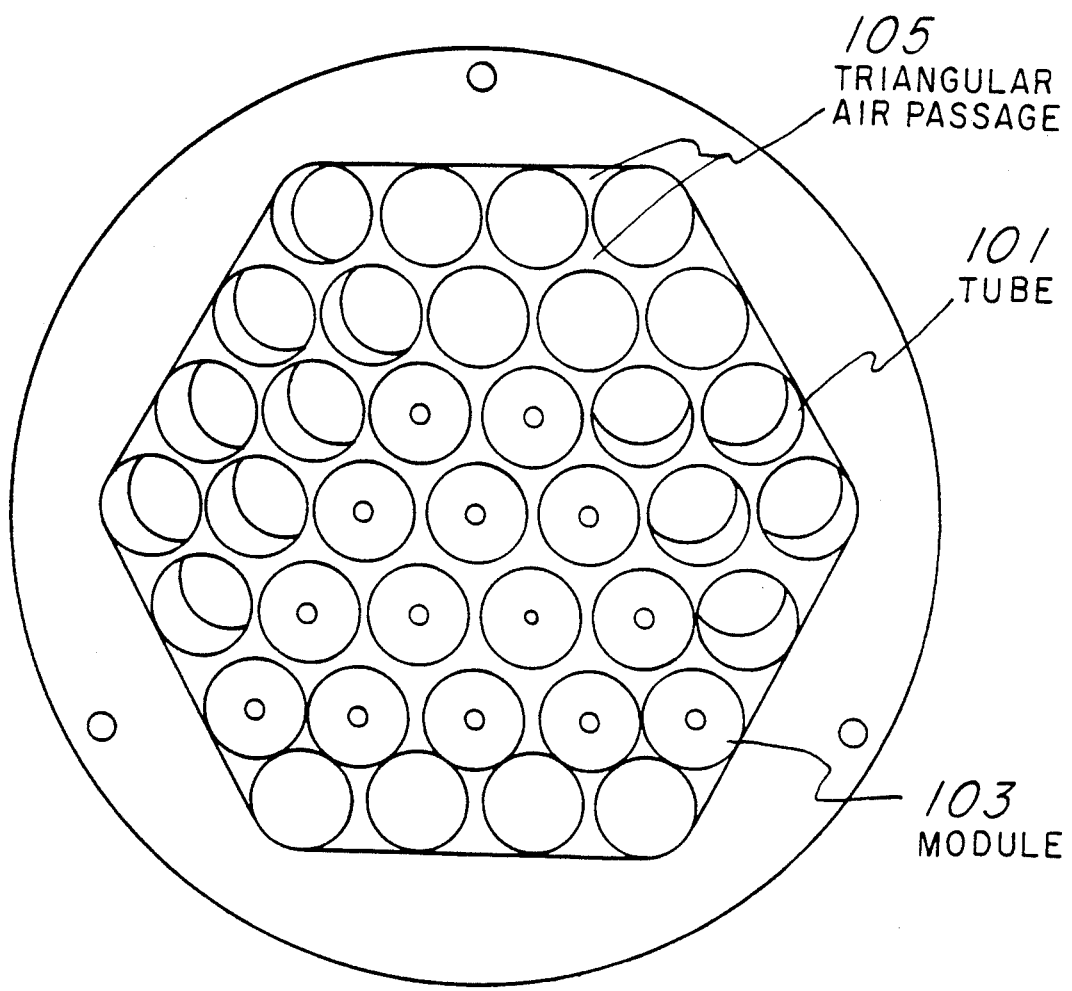
FIG. 9 is a front view of the embodiment of FIG. 8 with modules partially filling the air cooled assembly.
Figure 10:
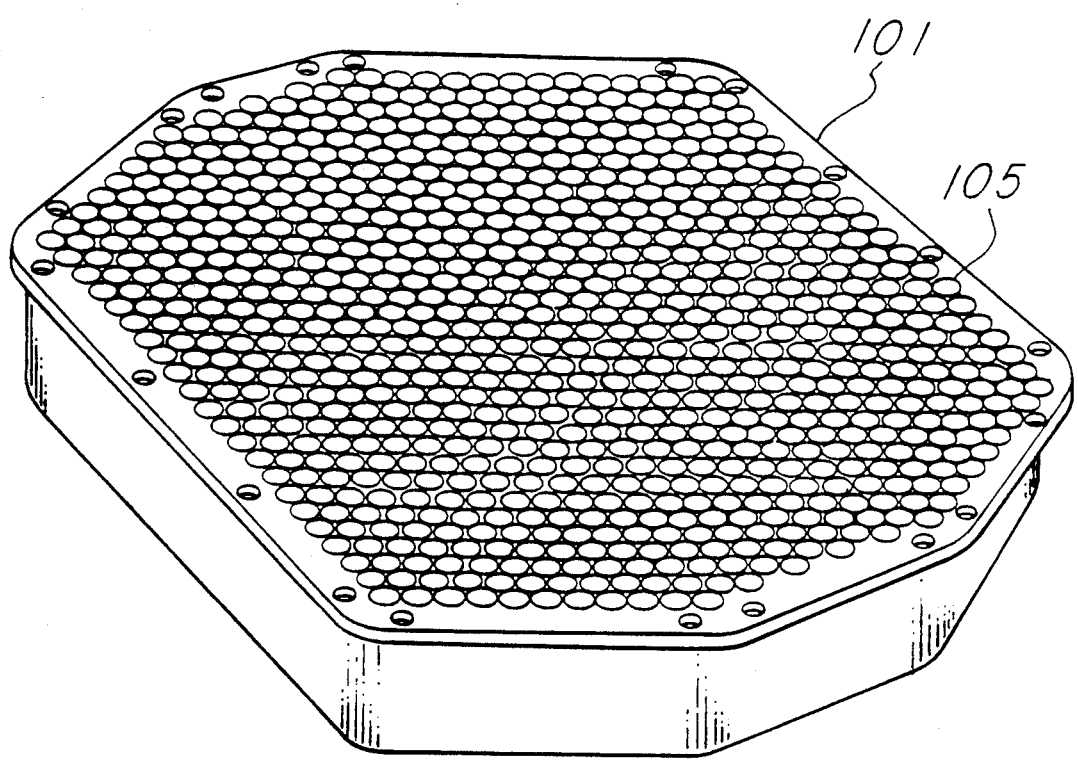
FIG. 10 is a perspective view of the embodiment of FIG. 8 with no modules installed.

Referring now to FIGS. 8 to 10, there is shown an air-cooled coldplate fourth embodiment of the invention. In this embodiment, the cooling tubes 110, which position and support modules 103, are arranged in a matrix arrangement of the type discussed in connection with the first embodiment. The tubes 110 that position and support the modules 100 are brazed, soldered or bonded together along the longitudinal length of the tubes 100. This forms a very strong structural assembly that accurately positions and structurally supports the modules and provides triangular coolant passages 106 along the longitudinal length of the tubes and modules. Inlet cooling air 107 is circulated around the outside perimeter of the array into a radome 109 covering the modules. The cooling air then turns and passes along the longitudinal axis of the tubes/modules. Heat dissipated by the modules is transferred to the cooling air as it passes past the modules and the air exits the array at the center of the array 111. The heat is removed from the air by passing the air through an external heat exchanger. The cooler air is then returned to the array and enters the array as inlet cooling air 107 around the perimeter. FIG. 9 shows one module 100 being inserted into one tube 110. The triangular air passages 106 are also shown. FIG. 10 shows a larger (1000 element) array of tubes 110 and triangular cooling air passages 105 without modules installed.

Figure 11:
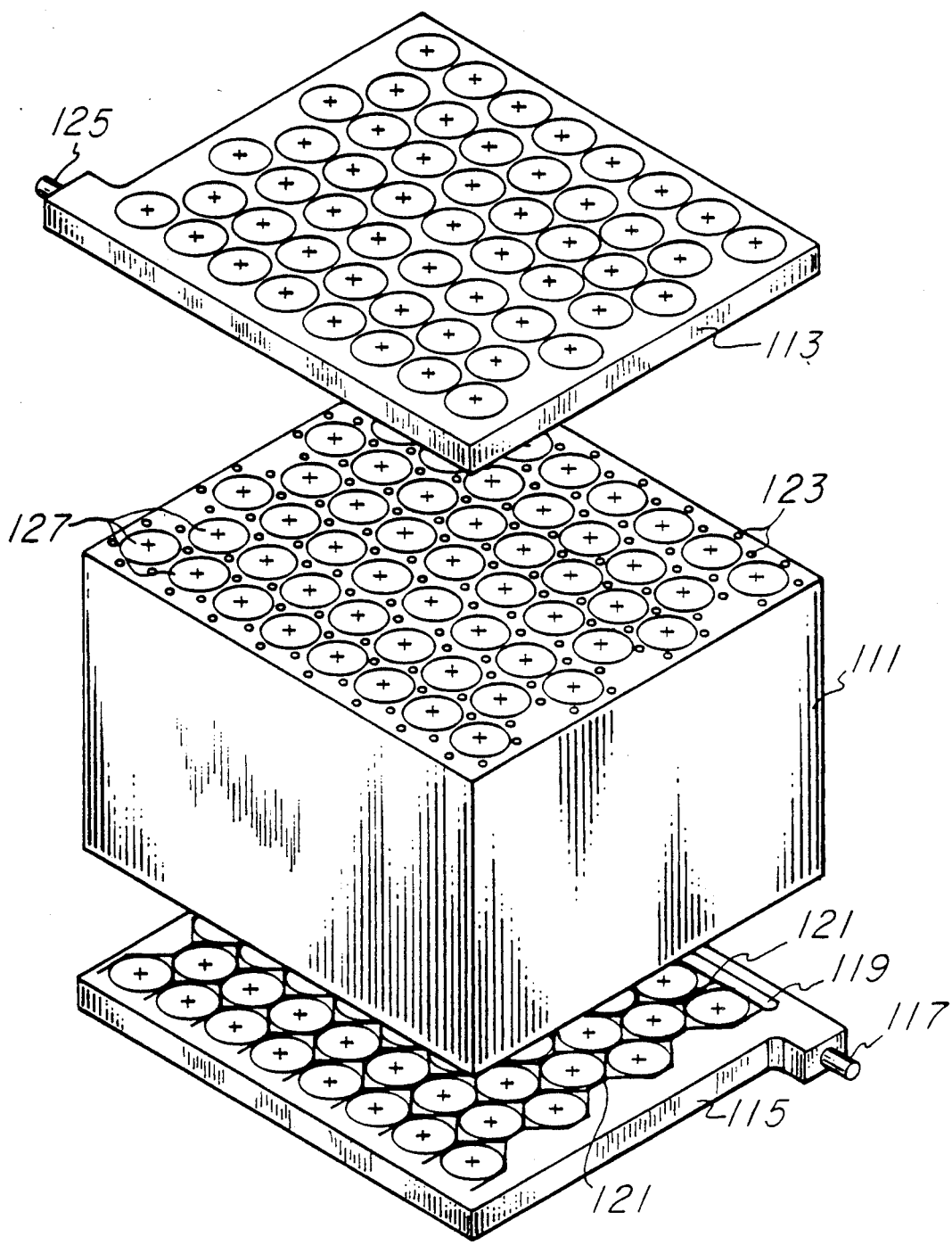
FIG. 11 is an exploded view of a coldplate in accordance with the present invention.

Referring now to FIG. 11, there is shown an axial-fluid flow coldplate, fifth embodiment in accordance with the present invention. This embodiment comprises a housing having a central portion 112, a front portion 113 and a rear portion 115 (113 is a mirror image of 115), all of which are connected together to provide a liquid tight enclosure. Liquid coolant enters the front portion 113 via the inlet 125 and accumulates in the manifold 119 (hidden from view on the aft side of 113). This liquid coolant then travels through grooves 121 in the interior of the front portion 113 and then through the channels 123 in the central portion 112 to grooves 121 in the rear portion 115. This liquid then travels to a manifold 119 in the rear portion 115 and then out through the outlet 117. It can be seen that the portions 113 and 115 can be mirror images using identical construction. The modules to be cooled are positioned in the apertures 127, heat emanating from the modules being carried off by the coolant in the channels.

Figure 12:
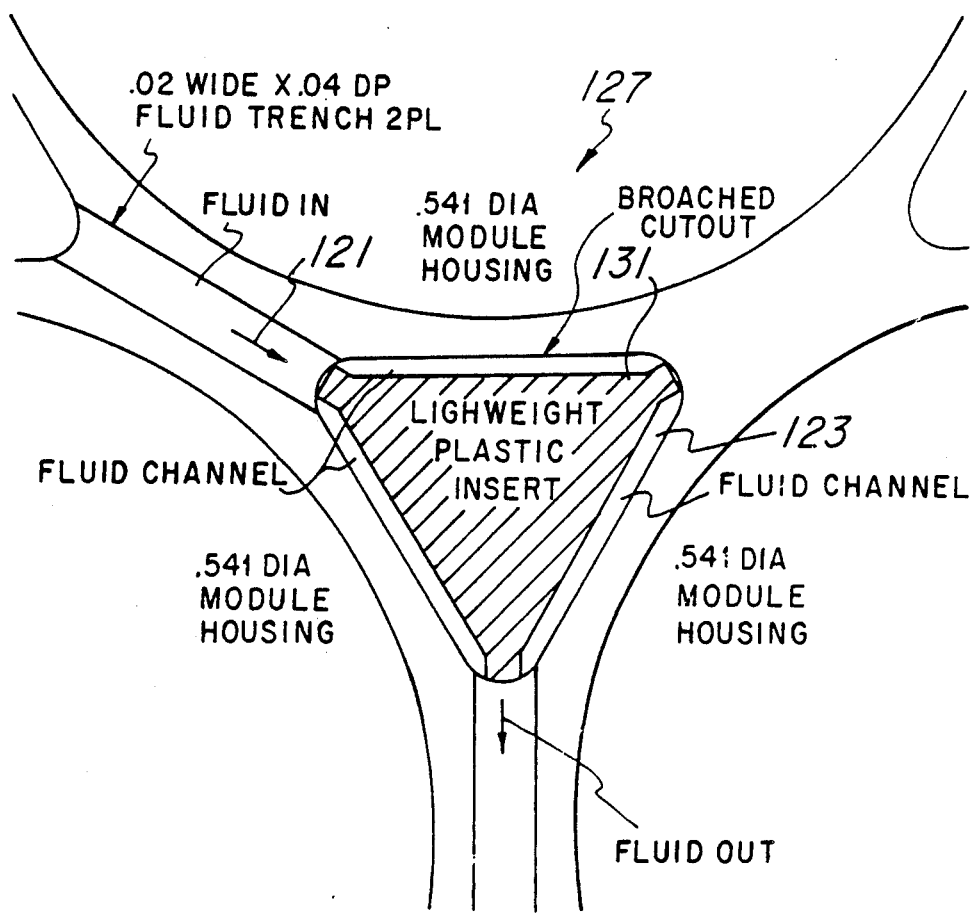
FIG. 12 is a cross-sectional view of a portion of a sixth embodiment in accordance with the present invention.

Referring now to FIG. 12, there is shown a sixth embodiment in accordance with the present invention. This embodiment shows a lightweight insert 131, preferably but not restricted to plastic, which is inserted in a coolant carrying channel in the prior embodiment to restrict coolant flow in those channels. The insert 131 can be shaped to provide a predetermined fluid flow, depending upon said shape. FIG. 12 shows the insert in an embodiment of the type shown in FIG. 11 with some triangular channels, corresponding reference characters depicting the same structure as in FIG. 11.

It can be seen that there has been described a cooling system for use in conjunction with heat producing electronic circuit modules wherein coolant is constantly circulated along channels formed closely adjacent the modules.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A coldplate system for cooling heat producing modules comprising:
   (a) a housing of predetermined length including an interior region and a wall region enclosing said interior region;
   (b) said interior region including a plurality of apertured regions defining slots having slot axes substantially normal to said length of said housing for receiving said circuit modules therein and for permitting fluid flow along the outer surfaces of said modules;
   (c) a fluid inlet path defined in said wall and extending from an exterior surface of said wall substantially coaxially with the axes of said slots for substantially the length of said slots; said fluid inlet path then extending substantially normal to said axes of said slots to said interior region; and
   (d) a fluid outlet path defined in said wall and extending from said exterior surface of said wall substantially coaxially with the axes of said slots a predetermined distance less than said fluid inlet path; said fluid outlet path then extending substantially normal to said axes of said slots to said interior region.

2. A coldplate system as set forth in claim 1 wherein at least one of said fluid inlet path and said fluid outlet path includes a removable insert disposed therein for controlling the amount of fluid flow therethrough.

3. A coldplate system as set forth in claim 1 wherein said housing and said apertured regions are formed from a plurality of secured together disks, each said disk having an exterior wall portion; alternate ones of said disks having a hollow central region of like predetermined shape and the remaining ones of said disks having aligned apertures formed in rows and columns.

4. A coldplate system as set forth in claim 3 wherein each of said disks includes an aperture in the wall portion thereof defining said fluid inlet path and predetermined adjacent ones of said disks include an aperture in the wall portion thereof defining said fluid outlet portion.

5. A coldplate system as set forth in claim 3 wherein each of said disks has a hollow central region most remote from said exterior surface which defines a second aperture communicating with said aperture therein defining said fluid inlet path and said hollow central region.

6. A coldplate system as set forth in claim 4 wherein each of said disks has a hollow central region most remote from said exterior surface which defines a second aperture communicating with said aperture therein defining said fluid inlet path and said hollow central region.

7. A coldplate system as set forth in claim 3 wherein a different one of said disks having a hollow central region defines an aperture communicating with said aperture therein defining said fluid outlet path and said hollow central region.

8. A coldplate system as set forth in claim 4 wherein a different one of said disks having a hollow central region defines an aperture communicating with said aperture therein defining said fluid outlet path and said hollow central region.

9. A coldplate system as set forth in claim 5 wherein a different one of said disks having a hollow central region defines an aperture communicating with said aperture therein defining said fluid outlet path and said hollow central region.

10. A coldplate system as set forth in claim 6 wherein a different one of said disks having a hollow central region defines an aperture communicating with said aperture therein defining said fluid outlet path and said hollow central region.

* * * * *